United States Patent [19]

Offenburger et al.

[11] Patent Number: 4,802,807
[45] Date of Patent: Feb. 7, 1989

[54] THREADED FASTENER

[75] Inventors: Mark Offenburger, Elgin; Eric Parker, Algonquin; Frank Ptak, Highland Park, all of Ill.

[73] Assignee: Illinois Tool Works Inc., Chicago, Ill.

[21] Appl. No.: 181,749

[22] Filed: Apr. 14, 1988

[51] Int. Cl.[4] .............................................. F16B 25/00
[52] U.S. Cl. ..................................... 411/387; 411/902; 411/914
[58] Field of Search ............... 411/386, 387, 411, 900, 411/901, 902, 914

[56] References Cited

U.S. PATENT DOCUMENTS

| 2,858,414 | 10/1958 | DAsh | 411/901 |
| 3,884,116 | 5/1975 | Hage | 411/387 |
| 4,730,970 | 3/1988 | Hyner et al. | 411/387 |

FOREIGN PATENT DOCUMENTS 36443 3/1979 Japan ..................... 411/902

Primary Examiner—Neill R. Wilson
Attorney, Agent, or Firm—Thomas W. Buckman; Neal C. Johnson

[57] ABSTRACT

A compositely plated, threaded fastener has zinc plating applied to a threaded fastener core and an aluminum plating is applied to the zinc underplating. Optionally, a polymeric top coat can be applied to the aluminum plating for pigmented appearance. The combination of the composite aluminum and zinc platings not only provide the fasteners with improved corrosion resistance but also provide particularly reduced torque load in driving such fasteners, for example, in drilling applications.

9 Claims, 1 Drawing Sheet

THREADED FASTENER

BACKGROUND OF THE INVENTION

This invention relates to threaded fasteners and more particularly relates to corrosion resistant drill screws.

Threaded fasteners such as typical drill screws are widely used for example in automotive applications in which the screws are driven directly into sheet metal and similar panels for attachment of a variety of fixtures. Particularly in such automotive applications corrosion resistance is an important requirement of such drill screws. As is well known, zinc-plated, galvanized steel screws have been conventionally employed for drill screw applications requiring such corrosion resistance. For similar applications, aluminum plated steel drill screws have more recently been developed and have additionally been provided with decorative and protective, pigmented top coatings such as polymeric paints.

It has been known, as described for example in Australian Pat. No. 73,297 and in U.S. Pat. No. 3,438,754, that zinc-plated steel articles such as structural sheets and panels can be improved in corrosion resistance by applying an aluminum overlay upon the zinc plating. The improved corrosion resistance of these compositely plated steel substrates has been effective for structural panels which are exposed to severely corrosive conditions such as salt spray.

In accordance with this invention, zinc and aluminum plated threaded fasteners not only provide improved corrosion resistance, but in addition provide particularly reduced torque load in driving such fasteners for example in drilling applications, such as in the automobile industry wherein ease and efficiency of drilling along with a significant spread between drilling torque and stripping torque are important fabrication objective.

SUMMARY OF THE INVENTION

In accordance with this invention a compositely plated, threaded fastener is provided in which zinc plating is applied to a threaded fastener core and an aluminum plating is applied to the zinc underplating. Optionally, a polymeric top coat can be applied to the aluminum plating, for example to achieve a pigmented appearance of such fasteners. The combination of the composite aluminum and zinc platings not only provides the fasteners with improved corrosion resistance but also provides particularly reduced torque load in driving such fasteners, for example, in drilling applications.

The thickness of the zinc plating on the threaded fastener core is preferably in a range of about 0.0002 to about 0.0010 inch and the thickness of the aluminum plating is preferably within a range of about 0.00005 to about 0.0010 inch.

DETAILED DESCRIPTION OF THE ILLUSTRATED EMBODIMENT

Figure 1:
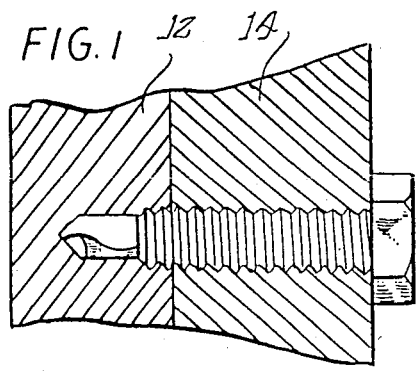
FIG. 1 is a fragmentary sectional view of two panels joined by an embodiment of the threaded fastener of the invention drilled into the panels.

The following description of the embodiment in the drawings is an example of the invention, but does not indicate limitation upon the scope of the appended claims.

Referring to FIG. 1, the drill screw fastener designated generally by reference character 10 secures the composite engagement of a typical sheet metal panel 12 and a fixture 14 such as metallic automotive component.

Figure 2:
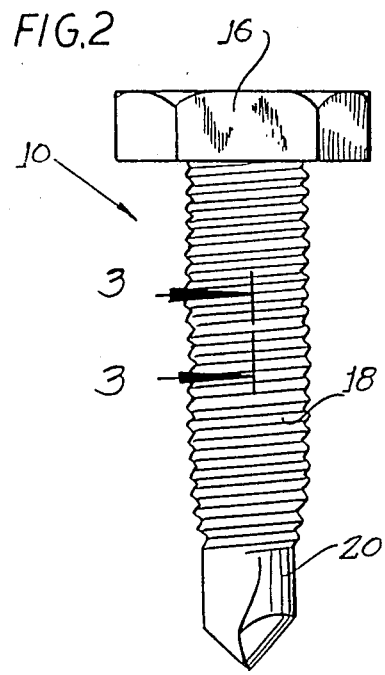
FIG. 2 is an elevational view of the threaded fastener shown in FIG. 1.
Figure 3:
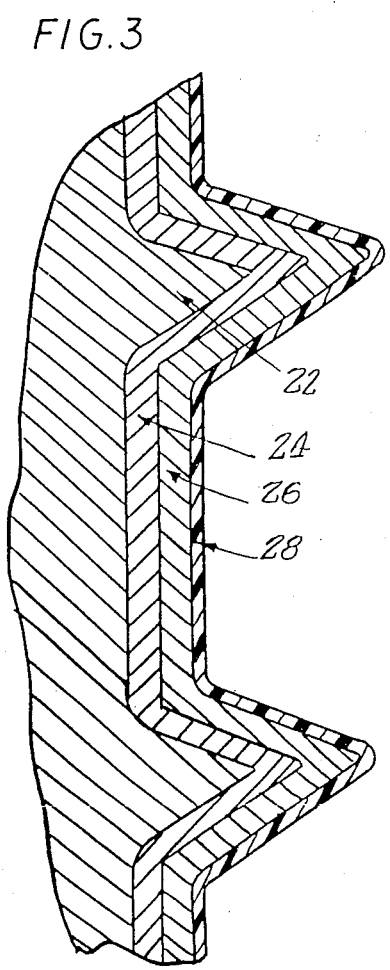
FIG. 3 is a sectional view taken along the line 3—3 in FIG. 2, illustrating the composite aluminum and zinc platings applied on the threaded core of the fastener; the illustrated relative proportions of the thicknesses of the platings is not intended to represent the precision of actual embodiments of the fasteners.

Referring to FIG. 2, the fastener 10 includes a driving head 16 and a threaded shank portion 18 with a fluted end drill 20. The layered structure and composition of the fastener 10 is illustrated with reference to FIG. 3 in which a conventional threaded steel core 22 is covered by a galvanizing zinc plating 24 which has an overlayer of aluminum plating 26. Optionally, a top coating comprising, for example, one or more polymeric coating materials can be applied to the aluminum plating 26. Suitable top coating materials include polymeric primers and paints such as epoxy materials which may include additives to promote organo-metallic bonding to the aluminum plating as more fully described in U.S. Pat. No. 4,715,316 the text of which is incorporated by reference herein.

The thickness of the zinc plating 24 on the threaded fastener core 22 is suitably in a range of about 0.0002 to about 0.0010 inch, preferably approximately 0.0003-0.0005 inch. The thickness of the aluminum plating is suitably within a range of about 0.00005 to about 0.0010 inch, preferably approximately 0.0001-0.00015 inch. The thickness of the polymeric top coat is suitably within the range of about 0.0005-0.0015.

Figure 4:
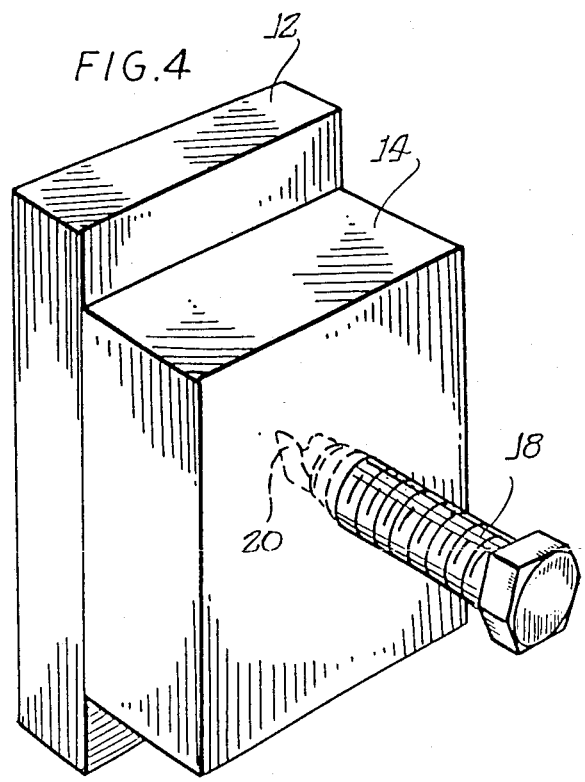
FIG. 4 is a perspective view of the panels of FIG. 1 illustrating initial drilling of the fastener.

The compositely plated fastener 10 produces not only superior corrosion resistance afforded by the aluminum plating applied on the zinc underplating, but in addition, the compositely plated fastener requires an unexpectedly reduced torque load in driving the fastener particularly into metallic panels as depicted in FIG. 4 such as in automotive assembly applications.

As shown in the following table, the compositely plated drill screw having aluminum plating applied on zinc underplating, produced surprisingly reduced torque load in comparison with drill screws which were plated with either zinc or aluminum alone. For example, the compositely plated drill screw of the invention produced approximately 18.7% reduction in the maximum torque load as compared with a drill screw having only zinc plating, and an approximately 44.8% torque reduction as compared with drill screws having only aluminum plating. The pronounced reduction in the torque load is comparable to the torque required to drive an entirely unplated drill screw with no applied corrosion protection. The comparative results shown in Table 1 represent the performance of 8/18 (4.2mm/1.41mm) type B thread drill screws driven into an unpainted, carbon steel panel having a thickness of 0.062 inch.

TABLE 1

| SCREW PLATING | DRILL TIME (SECONDS) | | DRIVE TORQUE (IN. - LBS.) | |
| --- | --- | --- | --- | --- |
| | Mean | Mean + 3 Std. Deviations | Mean | Mean + 3 Std. Deviations |
| Unplated | 1.719 | 2.174 | 12.092 | 15.185 |
| 0.0003 in Aluminum Only | 1.715 | 2.452 | 18.164 | 27.213 |
| 0.0003 in Zinc Only | 1.572 | 2.511 | 13.676 | 18.479 |
| 0.0003 in Zinc & 0.00015 in Aluminum | 1.746 | 2.360 | 12.280 | 15.029 |

A further benefit of the compositely plated drill screw according to the invention is the maintenance of an adequate margin between the torque level required to drive the drill screw and the higher torque level required to strip the threading of the drill screw; this margin is particularly important in providing control settings for automatic screw driving equipment in high speed assembly operations. This marginal difference between the driving torque load and the stripping torque load has been generally excessively narrow when such drill screws have only aluminum plating.

In applying the composite plating to the fasteners, the zinc plating layer 24 can be applied to the core 22 in suitably effective plating operations such as conventional galvanizing treatments. The aluminum plating 26 is preferably applied to the zinc plated core by ion vapor deposition techniques. For example, the aluminum plating can be applied by ion vapor deposition in which vaporized aluminum is charged by anodes in a high voltage system which accelerates the charged aluminum vapor molecules for deposit upon the zinc plated screws which are both charged and tumbled in an apertured container serving as the cathode of the system, as more fully described in U.S. Pat. No. 4,116,161 the text which is incorporated by reference herein. Following the application of aluminum plating to the zinc plated substrate of the fastener, the overcoat 28 can be applied, preferably prior to any significant oxidation of the aluminum plating.

In light of the foregoing description of the embodied compositely plated fastener, modifications will be evident to those skilled in the art and are within the broad scope of the appended claims.

THE INVENTION IS CLAIMED AS FOLLOWS

1. A threaded fastener having improved driving performance for corrosion-resistant securement of one or more metallic work pieces, said fastener comprising: a drive head; and a composite threaded shank comprising a threaded inner core; a zinc plating applied to said core; and an aluminum plating applied on said zinc plating, to promote lubricity in driving said shank into said work pieces.

2. The fastener according to claim 1 wherein said shank has a drilling configuration.

3. The fastener according to claim 1 wherein said shank has a top layer of polymeric coating material applied on said aluminum plating.

4. The fastener according to claim 1 wherein said aluminum plating is applied by ionized aluminum vapor deposition on said zinc plating.

5. The fastener according to claim 1 wherein said zinc plating has a thickness in the range of about 0.0002 to about 0.0010 inch.

6. The fastener according to claim 1 wherein said zinc plating has a thickness in the range of about 0.0003 to about 0.0005 inch.

7. The fastener according to claim 1 wherein said aluminum plating has a thickness in the range of about 0.00005 to about 0.00015 inch.

8. The fastener according to claim 1 wherein said aluminum plating has a thickness in the range of about 0.00005 to about 0.0010 inch.

9. The fastener according to claim 1 wherein said aluminum plating has a thickness in the range of about 0.0001 to about 0.00015 inch.

* * * * *